(12) United States Patent
Cullins et al.

(10) Patent No.: US 6,569,582 B2
(45) Date of Patent: May 27, 2003

(54) HINGED PELLICLES AND METHODS OF USE

(75) Inventors: Jerry C. Cullins, Austin, TX (US); Giang T. Dao, Fremont, CA (US)

(73) Assignee: Intel Corporation, Santa Clara, CA (US)

(*) Notice: Subject to any disclaimer, the term of this patent is extended or adjusted under 35 U.S.C. 154(b) by 78 days.

(21) Appl. No.: 09/840,373

(22) Filed: Apr. 23, 2001

(65) Prior Publication Data
US 2002/0155358 A1 Oct. 24, 2002

(51) Int. Cl.[7] .................................. G03F 9/00
(52) U.S. Cl. ........................................... 430/5
(58) Field of Search ............................. 430/5

(56) References Cited

U.S. PATENT DOCUMENTS

| | | | |
|---|---|---|---|
| 4,737,387 A | 4/1988 | Yen | 428/14 |
| 4,833,051 A | 5/1989 | Imamura | 430/5 |
| 5,959,721 A | 9/1999 | Nishi | 355/53 |

*Primary Examiner*—Christopher G. Young
(74) *Attorney, Agent, or Firm*—Schwegman, Lundberg, Woessner & Kluth, P.A.

(57) ABSTRACT

Apparatus and methods to protect a photomask that is used for semiconductor photolithography at wavelengths outside the visible spectrum include a hinged pellicle that is rotated away from the photomask during exposure. The pellicle can be transparent or opaque. In one embodiment, the photomask is supported by a photomask base, and the pellicle is hinged to one side of the photomask base. The pellicle can be moved away from the photomask by a robot arm. When covering the photomask base, the pellicle can be secured to it with a securing mechanism such as a vacuum arrangement. Methods of use are also described.

29 Claims, 6 Drawing Sheets

HINGED PELLICLES AND METHODS OF USE

RELATED APPLICATIONS

The present application is related to the following applications which are assigned to the same assignee as the present application:

Ser. No. 09/840,407, filed Apr. 23, 2001, entitled "Dual-Member Pellicle Assemblies and Methods of Use"; and Ser. No. 09/840,364, filed Apr. 23, 2001, entitled "Mechanized Retractable Pellicles and Methods of Use".

TECHNICAL FIELD

The present subject matter relates generally to the field of semiconductors and, more particularly, to hinged pellicles and methods of use.

BACKGROUND INFORMATION

In semiconductor processing, a photolithographic mask (photomask) is used to pattern a radiation sensitive layer on a semiconductor substrate. Typically, the radiation sensitive layer is called a photoresist layer. A "photomask" is defined herein as the combination of a photomask substrate and a patterning material. Typically, the substrate comprises a quartz or glass plate, which is transparent to the exposing radiation, and the patterning material lies on one side of the substrate and typically comprises chrome, aluminum, or gold, which is opaque to the exposing radiation. A stepping field is the portion of the patterning material that is used to pattern the photoresist layer.

The photoresist layer is sensitive to photomask defects, such as particles, for example. If a particle is present on a photomask within the stepping field when a photoresist layer is exposed using the photomask, the particle may cause a corresponding image to be formed in the patterned photoresist layer, which in turn may cause the device being fabricated to fail. If the stepping field of the photomask contains only one die, then all die on the semiconductor substrate may fail.

A pellicle is typically used to reduce the likelihood that particles migrate onto the stepping field of a photomask. A "pellicle" is defined herein to include a pellicle frame and a pellicle membrane or sheet. The pellicle sheet is typically a flat, usually organic material, such as nitrocellulose or cellulose acetate, and it may be coated with one or more layers of fluoropolymers.

FIG. 1 illustrates a perspective view of prior art semiconductor photolithography equipment 1, including a prior art pellicle. The equipment 1 includes an illumination optical system 2, including a source 4 of photolithographic radiation 6. The equipment 1 further includes a photomask substrate 10 having on its surface 12 a photolithographic pattern 14. The photomask comprises substrate 10 and photolithographic pattern 14.

To protect the photomask, a pellicle comprising pellicle frame 16 and pellicle membrane 18 is positioned a certain distance over the photomask. Pellicle frame 16 is typically a single-walled frame of metal, metal alloy, or plastic. Pellicle membrane 18 is typically securely fastened to pellicle frame 16 via an adhesive or adhesive tape (not shown).

A pellicle may be secured to a photomask to protect it from particles within the photolithography area, because photolithography is done in an ambient environment where particles are usually present, even in the cleanest of cleanroom environments.

The line dimensions of semiconductor devices are constantly shrinking. In order to achieve smaller patterning dimensions, photolithography must be carried out at increasingly shorter wavelengths. However, organic pellicle membranes typically cannot be used for shorter wavelengths. The high energy of the photons absorbed by the membrane can cause a chemical reaction in or near the pellicle membrane, causing it to deteriorate. Further, at wavelengths of approximately 200 nanometers (nm) and below a reaction occurs between the radiation and the air between the photomask and the pellicle membrane, producing ozone, which can break down organic pellicle membranes. In some instances, the pellicle membrane becomes damaged during only one exposure to the radiation.

For the reasons stated above, and for other reasons stated below which will become apparent to those skilled in the art upon reading and understanding the present specification, there is a significant need in the art for a pellicle device that adequately protects a photomask, but that does not deteriorate with exposure, as well as for methods of operating such a pellicle device.

DETAILED DESCRIPTION OF EMBODIMENTS OF THE INVENTION

In the following detailed description of embodiments of the invention, reference is made to the accompanying drawings which form a part hereof and in which is shown by way of illustration specific preferred embodiments in which the subject mailer may be practiced. These embodiments are described in sufficient detail to enable those skilled in the art to practice them, and it is to be understood that other embodiments may be utilized and that architectural, optical, compositional, mechanical, and electrical changes may be made without departing from the spirit and scope of the present disclosure. The following detailed description is, therefore, not to be taken in a limiting sense, and the scope of embodiments of the present subject matter is defined only by the appended claims.

The present subject matter provides a solution to the problem of pellicle membrane deterioration to radiation beyond the visible light spectrum, such as ultraviolet, deep ultraviolet, extreme ultraviolet, X-ray, electron beam, ion beam, and the like. The range being used and being evaluated by current semiconductor photolithography is in the range of 2 to 200 nm, but embodiments of the invention are not limited to such range.

Various embodiments are illustrated and described herein. In one embodiment, the pellicle frame is hinged to allow the pellicle to be rotated away from the photomask during exposure and then replaced when exposure is not occurring. In another embodiment, a transport mechanism is used to rotate the pellicle away from the photomask during exposure. To secure the pellicle and photomask in proper alignment, vacuum force can be used. Methods of using a hinged pellicle and of using photolithographic equipment are also described.

The present subject matter, as implemented in various embodiments, provides protection of photomasks at the exposure wavelengths mentioned earlier.

Figure 1:
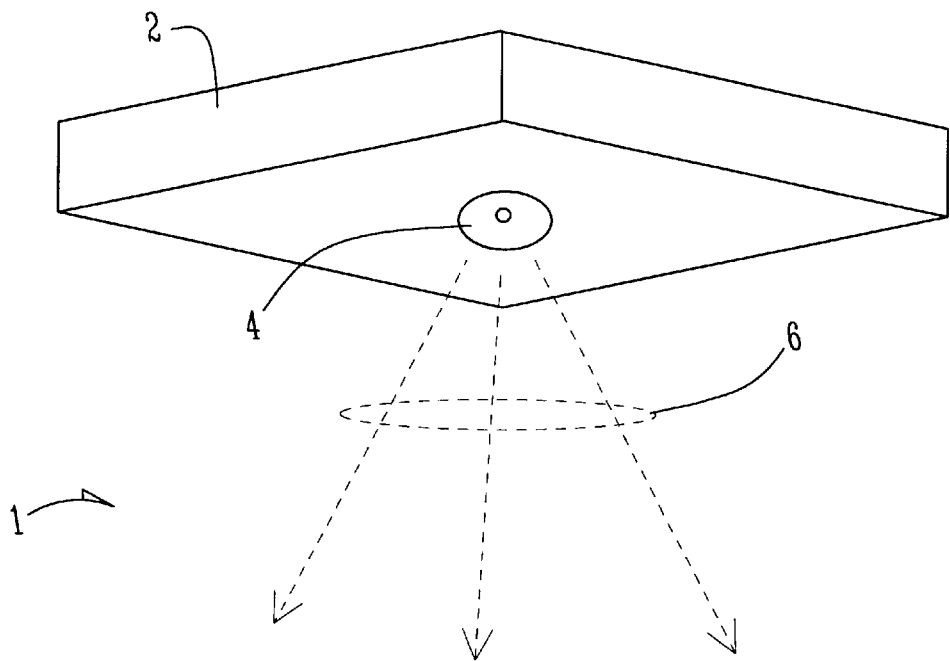
FIG. 1 illustrates a perspective view of prior art semiconductor photolithography equipment, including a prior art pellicle.
Figure 1:
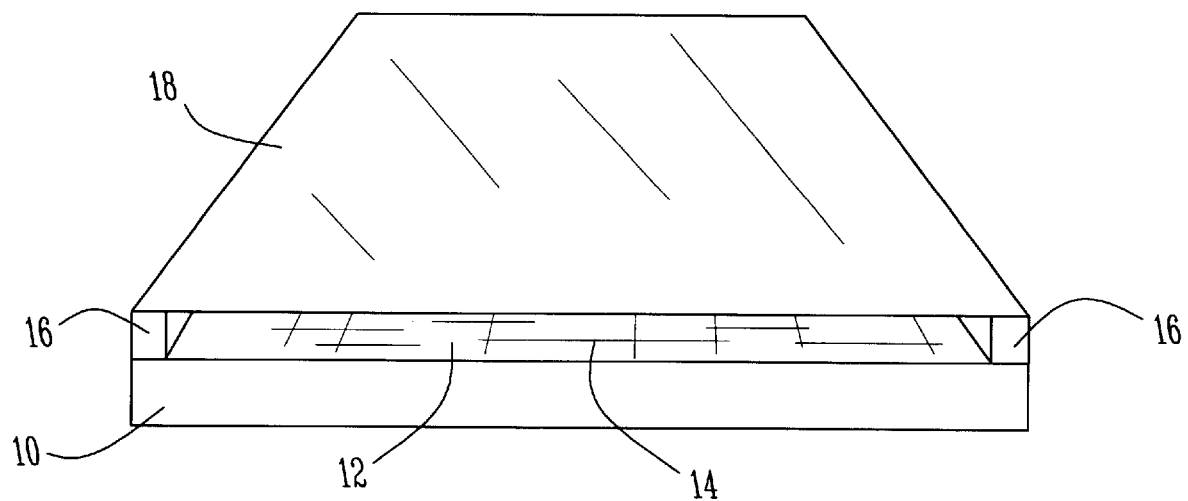
Figure 2:
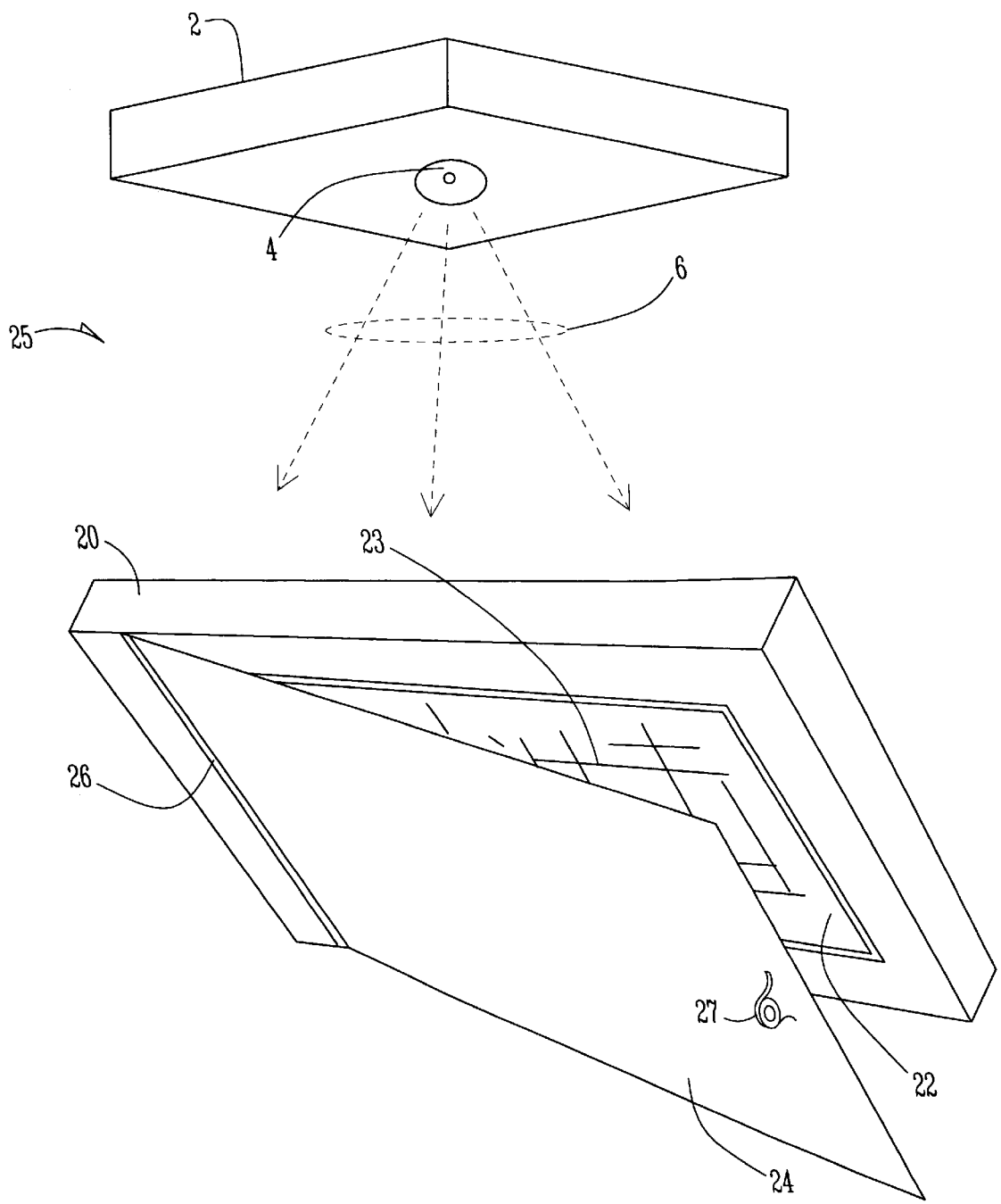
FIG. 2 illustrates a perspective view of photolithographic equipment to perform transmissive mask-based lithography, in accordance with one embodiment of the invention.

FIG. 2 illustrates a perspective view of photolithographic equipment 25 to perform transmissive mask-based lithography, in accordance with one embodiment of the invention. Transmissive mask-based lithography can be used, for example, with photolithographic radiation in the visible light spectrum, although it is not limited to the visible light spectrum. The equipment 25 includes an illumination optical system 2, including a suitable source 4 of photolithographic radiation 6, such as a laser or bulb.

The equipment 25 further includes a photomask base or substrate 20 that comprises a photomask 22 having a photomask pattern or photolithographic pattern 23. In this embodiment, photolithographic pattern 23 is on the surface of substrate 20 that is facing away from source 4.

Photolithographic equipment 25 additionally comprises a pellicle 24 coupled to photomask base 20 via any suitable coupling element or mechanism, such as hinge 26. Pellicle 24 can be rotated away from photomask 22 via hinge 26 and out of the path of photolithographic radiation 6 passing through photomask 22.

In one embodiment, a suitable transport element such as an eyelet or ring 27 is provided on pellicle 24 with which pellicle 24 is rotated, either manually or via a machine part, away from photomask 22. Other types of transport elements include handles, tabs, bars, tethers, cords, chains, cables, pulls, knobs, holes, detents, indentations, recesses, or any other type of element that can be grasped. Alternatively, a transport element can be omitted, for example, if pellicle 24 projects outwardly from photomask base 20 on one or more sides, and pellicle 24 could be rotated by grasping the projecting area(s). As yet another alternative, pellicle 24 could be rotated by vacuum force. Pellicle 24 can also be held in place covering photomask 22 using a vacuum force or any other suitable mechanism, such as a spring.

Although pellicle 24 is shown coupled to a narrow dimension of photomask base 20, it can alternatively be coupled to a longer dimension of photomask base 20. Although photomask base 20 is depicted as relatively thick, it could be relatively thin. Photomask base 20 can comprise other photolithography equipment (not shown) in addition to the photomask 22.

Pellicle 24 can be of any type of material, such as those mentioned earlier. Pellicle 24 can be opaque, transparent, or it can comprise a combination of opaque and transparent portions. The terms "opaque" and "transparent" can be relative to either or both the exposure (i.e. lithographic) wavelength and an inspection wavelength. Typically an inspection wavelength as in the visible range, but for the present subject matter it is not limited to such range. In one embodiment, pellicle 24 comprises a transparent portion (Dot shown), e.g. of quartz, plexiglass, a polymeric film, or other suitable material, that is commensurate in size with photomask pattern 23, and pellicle 24 is kept in place during inspection using visible radiation but is removed during exposure to photolithographic radiation. This type of embodiment of pellicle 24 can be similar to pellicle 80 (FIG. 6) having a transparent portion 82 to allow optical inspection of the photomask without removal of the pellicle.

If pellicle 24 is transparent or has a transparent portion, and if the frame height (i.e. the thickness of the photomask substrate 20) is the proper height (such as 5.4 millimeters or less in one embodiment), pellicle 24 can be left in place for inspection that uses electromagnetic radiation at longer wavelengths that typically will not cause damage to the transparent portion of the pellicle.

Still with reference to FIG. 2, pellicle 24 can be formed of a non-deformable material. In addition to those materials mentioned above, pellicle 24 could be formed of any other type of material such as a metal, like aluminum or stainless steel, or a metal alloy. Pellicle 24 can cover the entire photomask 22, or it can cover just the photomask pattern 23.

Pellicle 24 is movable between a first position in which pellicle 24 is coupled to and covers photomask base 20, and a second position wherein pellicle 24 does not cover photomask base 20. In a transmissive mask-based lithographic embodiment, wherein photolithographic radiation 6 passes through photomask substrate 20, through photomask 22, through other optical equipment (not depicted), and finally onto a semiconductor wafer (not shown), pellicle 24 is moved away from photomask 22 during exposure, i.e. when photolithographic radiation 6 is passing through photomask 22. At other times, pellicle 24 is moved into position to cover and protect photomask 22.

If pellicle 24 is opaque, it is also moved away from photomask 22 during inspection of photomask 22. If pellicle 24 comprises a transparent window (similar to that of pellicle 80 depicted in FIG. 6), pellicle 24 can be kept in place during inspection. An advantage of a pellicle 24 having a transparent window for inspection radiation is that it lowers the risk of particles contaminating the photomask surface, because there are fewer operations that require the pellicle to be moved away from the photomask 22.

Although pellicle 24 is depicted in FIG. 2 as being rectangular, in other embodiments pellicle 24 can take the form of a different polygon (including a polygon having sides of unequal lengths), a circle, an ellipse, or a free-form geometrical shape.

An advantage that the hinged pellicle 24 has over prior art pellicle arrangements is that pellicle 24 can be readily rotated away from photomask 22 when photomask 22 is subjected to photolithographic radiation 6, or when it is desired to inspect photomask 22 (for embodiments wherein pellicle 24 is opaque).

Figure 3:
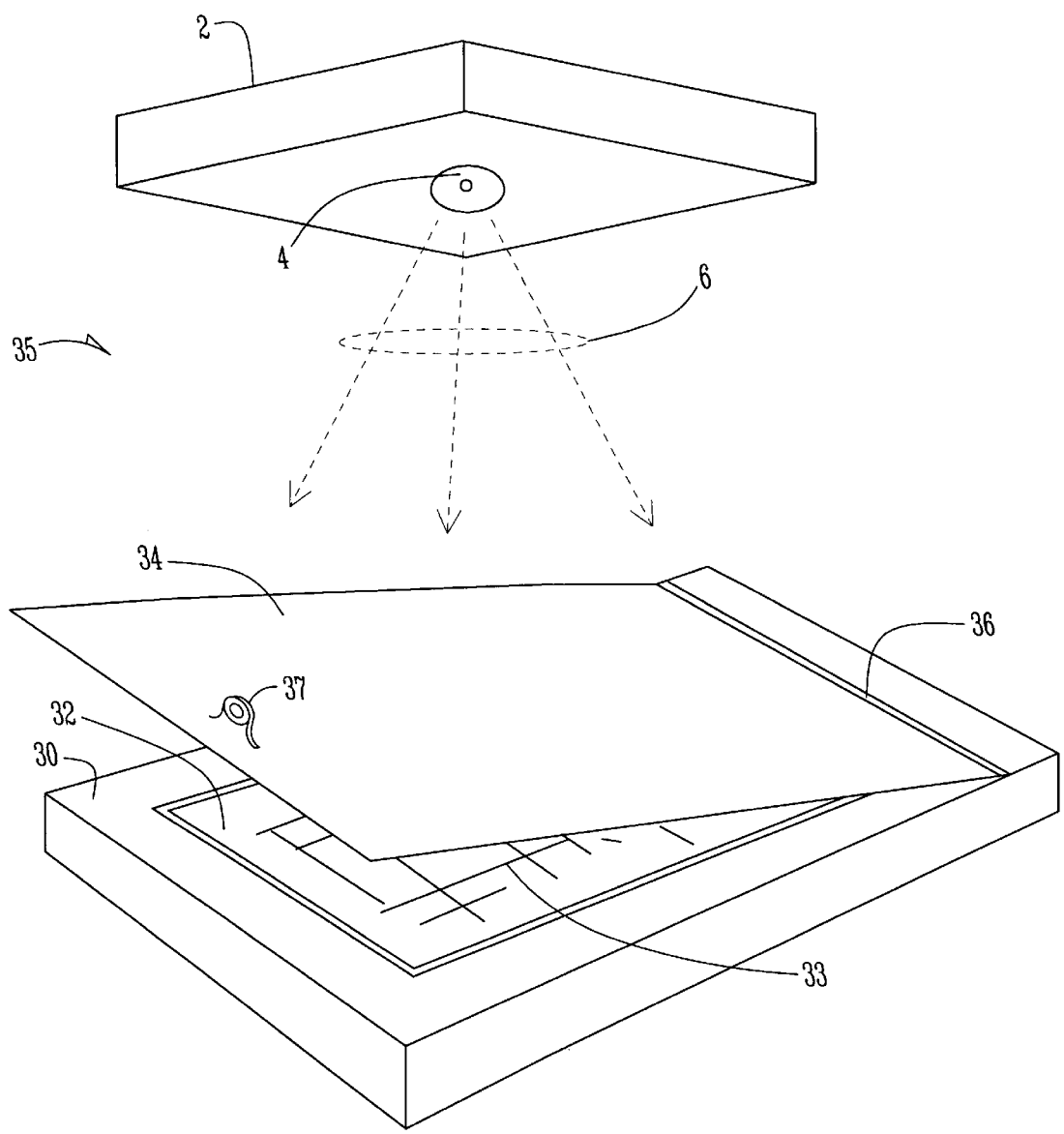
FIG. 3 illustrates a perspective view of photolithographic equipment to perform reflective mask-based lithography, in accordance with one embodiment of the invention.

FIG. 3 illustrates a perspective view of photolithographic equipment 35 to perform reflective mask-based lithography in accordance with one embodiment of the invention. Reflective mask-based lithography can be used, for example, with extreme ultraviolet (EUV) photolithographic radiation, although it is not limited to EUV radiation. The equipment 35 includes an illumination optical system 2, including a source 4 of photolithographic radiation 6, such as a laser or bulb.

The equipment 35 further includes a photomask base or substrate 30 that comprises a photomask 32 having a photomask pattern or photolithographic pattern 33. In this embodiment, photolithographic pattern 33 is on the surface of substrate 30 that is facing towards source 4.

Photolithographic equipment 35 additionally comprises a pellicle 34 coupled to photomask base 30 via any suitable coupling element or mechanism, such as hinge 36. Pellicle 34 can be rotated away from photomask 32 via hinge 36 and out of the path of photolithographic radiation 6.

In one embodiment, a suitable transport element such as an eyelet or ring 37 is provided on pellicle 34 with which pellicle 34 is rotated, either manually or via a machine part, away from photomask 32. Other types of transport elements include handles, tabs, bars, tethers, cords, chains, cables, pulls, knobs, holes, detents, indentations, recesses, or any other type of element that can be grasped. Alternatively, a transport element can be omitted, for example, if pellicle 34 projects outwardly from photomask base 30 on one or more sides, and pellicle 34 could be lifted by grasping the projecting area(s). As yet another alternative, pellicle 34 could be lifted by vacuum force.

Although pellicle 34 is shown coupled to a narrow dimension of photomask base 30, it can alternatively be coupled to a longer dimension of photomask base 30. Although photomask base 30 is depicted as relatively thick, it could be relatively thin. Photomask base 30 can comprise other photolithography equipment (not shown) in addition to the photomask 32.

Pellicle 34 can be of any type of material, such as those mentioned earlier. Pellicle 34 can be opaque, transparent, or it can comprise a combination of opaque and transparent portions. The terms "opaque" and "transparent" can be relative to either or both the exposure (i.e. lithographic) wavelength and an inspection wavelength. Typically an inspection wavelength is in the visible range, but for the present subject matter it is not limited to such range. In one embodiment, pellicle 34 comprises a transparent portion (not shown), e.g. of quartz, plexiglass, a polymeric film, or other suitable material, that is commensurate in size with photomask pattern 33, and pellicle 34 is kept in place during inspection using visible radiation but is removed during exposure to photolithographic radiation. This type of embodiment of pellicle 34 can be similar to pellicle 80 (FIG. 6) having a transparent portion 82 to allow optical inspection of the photomask without removal of the pellicle.

Pellicle 34 can be formed of a non-deformable material. In addition to those materials mentioned above, pellicle 34 could be formed of any other type of material such as a metal, like aluminum or stainless steel, or a metal alloy. Pellicle 34 can cover the entire photomask 32, or it can cover just the photomask pattern 33.

Pellicle 34 is movable between a first position in which pellicle 34 is coupled to and covers photomask base 30, and a second position wherein pellicle 34 does not cover photomask base 30. In a reflective mask-based lithographic embodiment, pellicle 34 is moved away from photomask 32 during exposure, i.e. when photolithographic radiation 6 is reflecting off photomask 32 and into other optical equipment (not shown) before being directed at a semiconductor wafer (not shown). At other times, pellicle 34 is moved into position to cover and protect photomask 32.

If pellicle 34 is opaque, it is also moved away from photomask 32 during inspection of photomask 32. If pellicle 34 comprises a transparent window (similar to that of pellicle 80 depicted in FIG. 6), pellicle 34 can be kept in place during inspection.

Although pellicle 34 is depicted in FIG. 3 as being rectangular, in other embodiments pellicle 34 can take the form of a different polygon (including a polygon having sides of unequal lengths), a circle, an ellipse, or a free-form geometrical shape.

An advantage that the hinged pellicle 34 has over prior art pellicle arrangements is that pellicle 34 can be readily rotated away from photomask 32 when photomask 32 is subjected to photolithographic radiation 6, or when it is desired to inspect photomask 32 (for embodiments wherein pellicle 34 is opaque).

Figure 4:
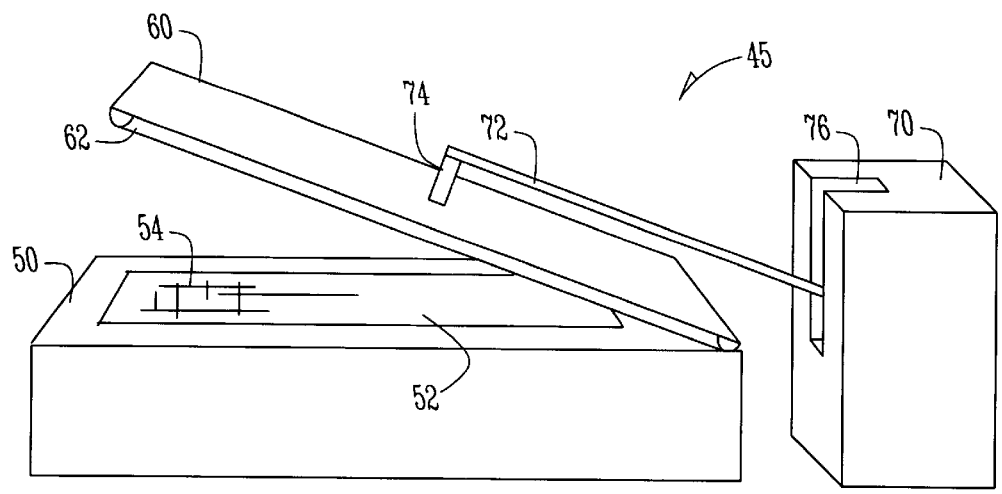
FIG. 4 illustrates a perspective view of photolithographic equipment in accordance with an embodiment of the invention.

FIG. 4 illustrates a perspective view of photolithographic equipment 45 in accordance with an embodiment of the invention. The equipment 45 includes a photomask base 50 that supports a photomask 52 comprising a photolithographic pattern 54.

A pellicle 60 is coupled to photomask base 50 via any suitable coupling element or mechanism, such as a hinge (not shown) that can be similar to that illustrated in FIG. 3. Pellicle 60 can be similar to pellicle 34 described regarding FIG. 3. Pellicle 60 comprises a sealing element in the form of gasket, molding, or seal 62 located, for example, around its periphery. A suitable transport element, for example robot arm 72, is used to move pellicle 60 between a first position to cover photomask 52 and a second position to expose photomask 52 to a source (not shown) of photolithographic radiation that can be similar to that shown in FIGS. 2 and 3.

In one embodiment, robot arm 72 is coupled to a transport unit 70. Transport unit 70 comprises suitable mechanical, electromechanical, and/or electronic elements to control the desired movement of pellicle 60. One of ordinary skill in the art can design and implement a suitable transport unit 70, depending upon the requirements of the particular photolithography equipment. In FIG. 4, transport unit 70 has a slot 76 enabling robot arm 72 to be elevated substantially vertically when pellicle 60 is in a position to allow photomask 52 to be exposed to photolithographic radiation.

To secure pellicle 60 to photomask 52 or to photomask base 50, a suitable securing mechanism is provided. In one embodiment, vacuum is provided through an internal tube or chamber (not shown) within robot arm 72 to pipe 74 attached to the end of robot arm 72. Pipe 74 constitutes a vacuum element that is coupled to pellicle 60, and it comprises an aperture 77 (FIG. 5) that opens to the underside of pellicle 60. When pellicle 60 is in a position resting against photomask base 50 or an unpatterned peripheral region of photomask 52, vacuum is provided from transport unit 70 through robot arm 72 and pipe 74 to the surface or region enclosed by seal 62 of pellicle 60, thus securing pellicle 60 against photomask base 50 or photomask 52. A suitable valve (not shown) can be associated with robot arm 72, pipe 74, transport unit 70, or pellicle 60, or it can be placed at any other suitable location, in order to apply or break vacuum.

Pipe 74, robot arm 72, and transport unit 70 can be made to be readily detachable from each other, and from pellicle 60. In another embodiment, robot arm 72 could be a flexible hose rather than a stiff element, e.g. if it is positioned above rather than to the side of pellicle 60, or if a different type of transport element is used to move pellicle 60 with respect to photomask 52.

The present subject matter is not limited to a vacuum-operated securing mechanism, and any other suitable securing mechanism can be employed. Alternatively, it is not essential to the present subject matter to utilize any securing mechanism.

Although pellicle 60 is depicted in FIG. 4 as being rectangular, in other embodiments, pellicle 60 can take the form of a different polygon (including a polygon having sides of unequal lengths), a circle, an ellipse, or a free-form geometrical shape.

Figure 5:
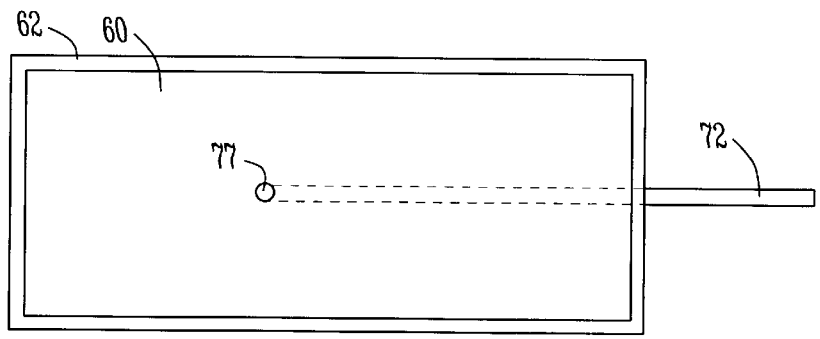
FIG. 5 illustrates a bottom view of the pellicle shown in FIG. 4.

FIG. 5 illustrates a bottom view of the pellicle 60 shown in FIG. 4, in which seal 62 is seen around the periphery of the bottom surface of pellicle 60. Seal 62 need not be positioned at the periphery and could be located at any appropriate distance in from the periphery. Alternatively, a portion of seal 62 could be located on the periphery, and another portion or portions could be located in from the periphery. Also seen in FIG. 5 are robot arm 72 and aperture 77 of pipe 74.

Figure 6:
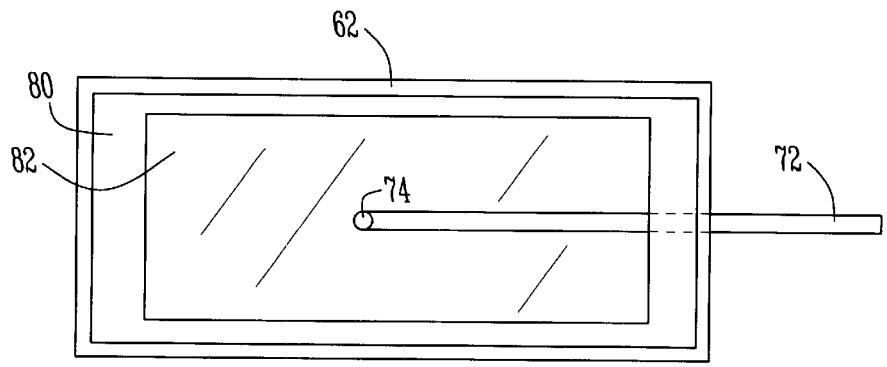
FIG. 6 illustrates a bottom view of an alternative embodiment of a pellicle.

FIG. 6 illustrates a bottom view of an alternative embodiment of a pellicle 80. Pellicle 80 is similar to pellicle 60 shown in FIG. 4. Pellicle 80 comprises a transparent portion 82 to enable pellicle 80 to be inspected at an inspection wavelength without moving pellicle 80 away from the photomask it is covering.

Figure 7:
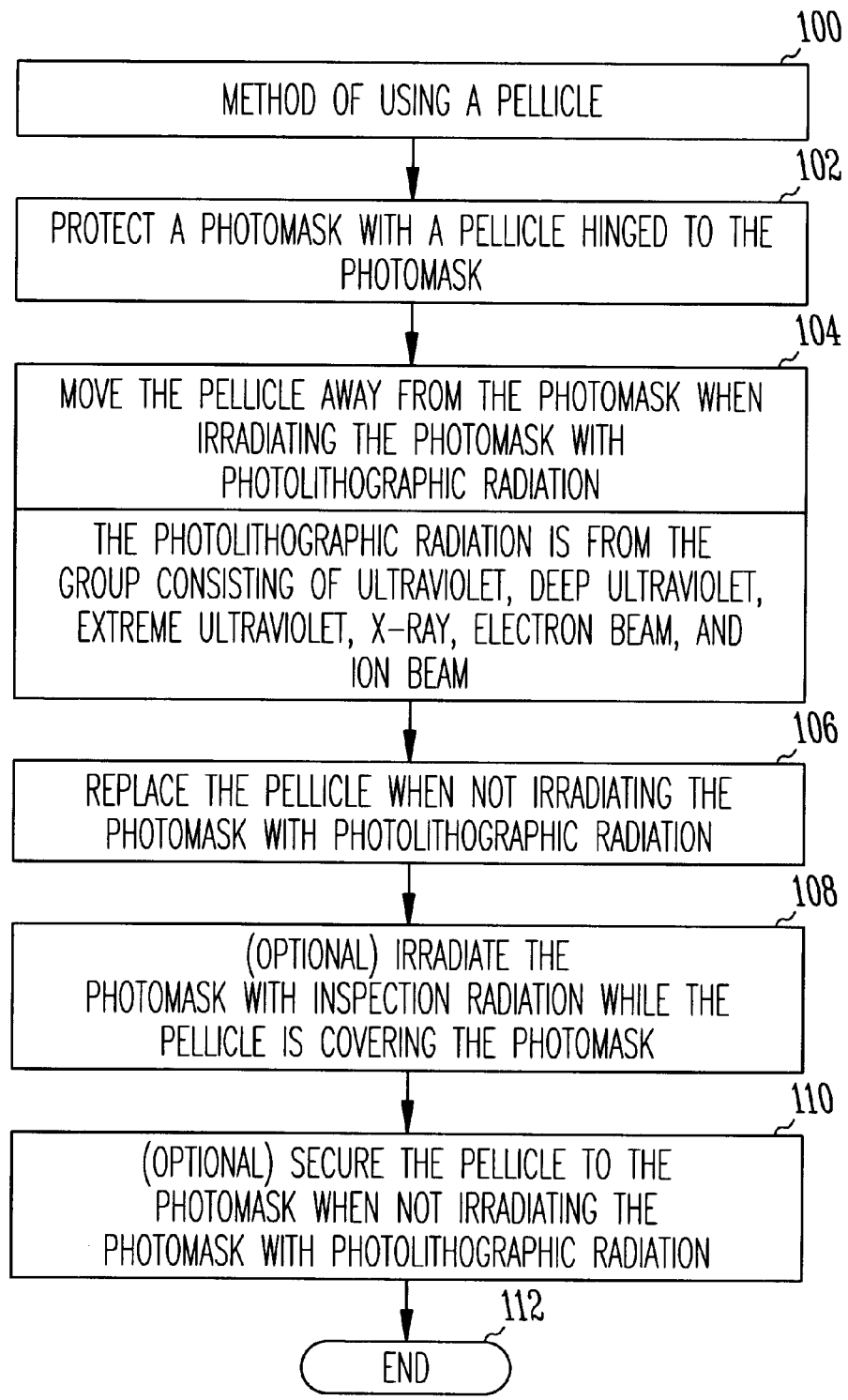
FIG. 7 illustrates a flow diagram of a method of using a pellicle, in accordance with one embodiment of the invention.

FIG. 7 illustrates a flow diagram of a method 100 of using a pellicle, in accordance with one embodiment of the invention.

In 102, a photomask is protected with a pellicle hinged to the photomask.

In 104, the pellicle is moved away from the photomask when the photomask is irradiated with photolithographic radiation. The photolithographic radiation is from the group consisting of ultraviolet, deep ultraviolet, extreme ultraviolet, X-ray, electron beam, and ion beam radiation.

In 106, the pellicle is replaced when the photomask is not being irradiated with photolithographic radiation.

In 108 (optional), the photomask is irradiated with inspection radiation while the pellicle is covering the photomask.

In 110 (optional), the pellicle is secured to the photomask when the photomask is not being irradiated with photolithographic radiation.

Although FIG. 7 depicts the method ending in 112, it will be understood that the method can be indefinitely repeated.

Figure 8:
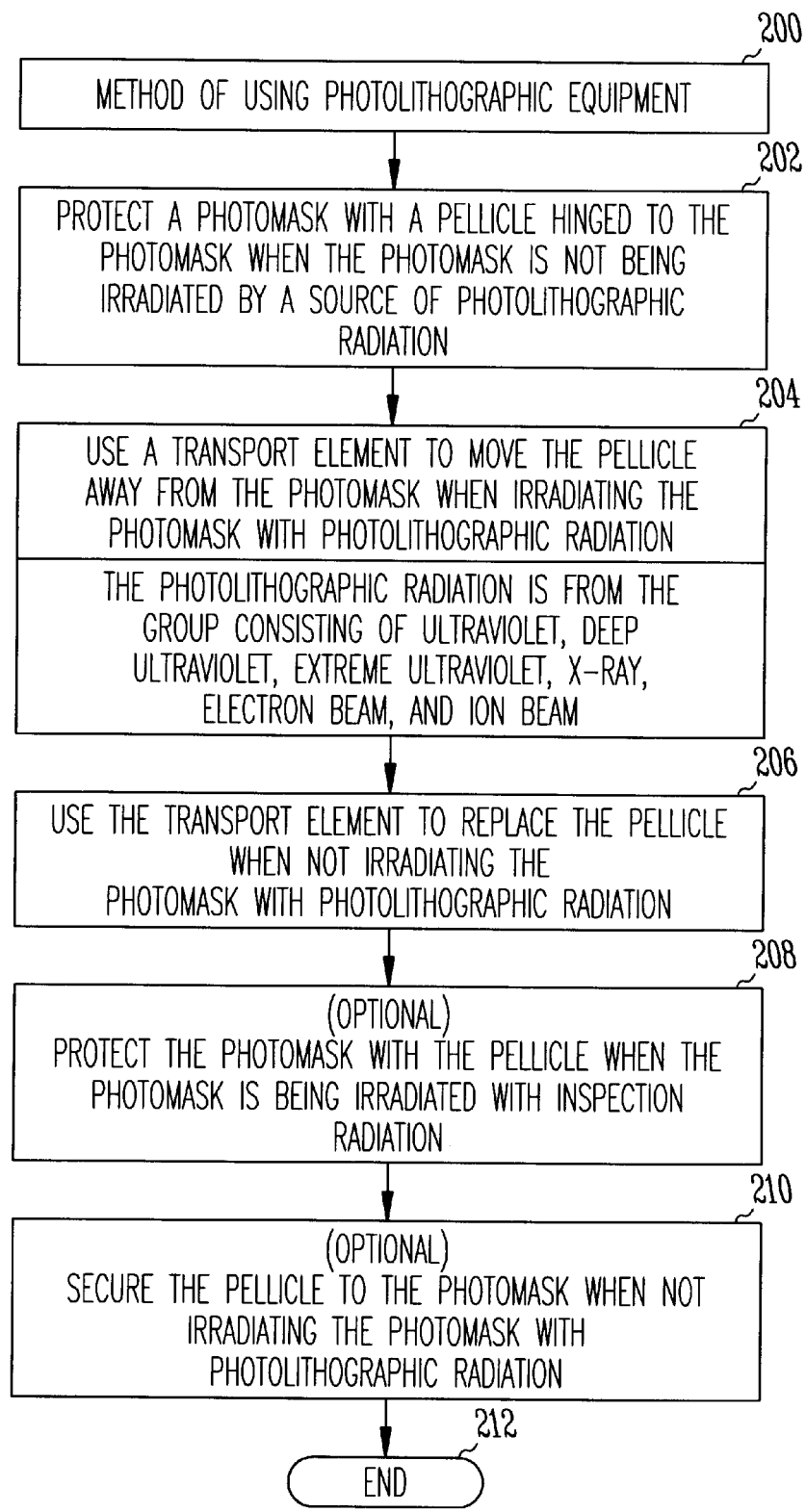
FIG. 8 illustrates a flow diagram of a method of using photolithographic equipment, in accordance with one embodiment of the invention.

FIG. 8 illustrates a flow diagram of a method 200 of using photolithographic equipment, in accordance with one embodiment of the invention.

In 202, a photomask is protected with a pellicle hinged to the photomask when the photomask is not being irradiated by a source of photolithographic radiation.

In 204, a transport element is used to move the pellicle away from the photomask when the photomask is irradiated with photolithographic radiation. The photolithographic radiation is from the group consisting of ultraviolet, deep ultraviolet, extreme ultraviolet, X-ray, electron beam, and ion beam radiation.

In 206, the transport element is used to replace the pellicle when the photomask is not being irradiated with photolithographic radiation.

In 208 (optional), the photomask is protected with the pellicle when the photomask is being irradiated with inspection radiation.

In 210 (optional), the pellicle is secured to the photomask when the photomask is not being irradiated with photolithographic radiation.

Although FIG. 8 depicts the method ending in 212, it will be understood that the method can be indefinitely repeated.

Conclusion

The present subject matter provides for apparatus and methods that permit the use of pellicles for photolithographic operations using high-energy short-wavelength radiation and/or radiation beyond the visible light spectrum. By employing a hinged pellicle, which can be rotated away from the photomask during exposure to photolithographic radiation, the pellicle is not damaged by the photolithographic radiation. As a result, the subject matter reduces semiconductor production costs and enables semiconductors to be marketed more competitively and with higher quality than with known apparatus and methods for performing semiconductor photolithography.

As shown herein, the present subject mater can be implemented in a number of different embodiments, including but not limited to a pellicle device, an apparatus to protect a photomask, and various methods, including a method of protecting a photomask, and a method of using photolithographic equipment. Other embodiments will be readily apparent to those of ordinary skill in the art.

The architecture, optics, composition, materials, dimensions, and sequence of operations can all be varied to suit particular requirements of semiconductor photolithographic environments. For example, a system to perform transmissive mask-based lithography could utilize a photomask in which the photolithographic pattern is facing towards the light source, rather than facing away from the light source as shown in FIG. 2.

The various elements depicted in the drawings are merely representational and are not drawn to scale. Certain proportions thereof may be exaggerated, while others may be minimized. The drawings are intended to illustrate various implementations of the subject matter, which can be understood and appropriately carried out by those of ordinary skill in the art.

Although specific embodiments have been illustrated and described herein, it will be appreciated by those of ordinary skill in the art that any arrangement that is calculated to achieve the same purpose may be substituted for the specific embodiment shown. This application is intended to cover any adaptations or variations of the present invention. Therefore, it is manifestly intended that embodiments of this invention be limited only by the claims and the equivalents thereof.

What is claimed is:

1. A pellicle device comprising:
   a photomask coupled to a photomask base; and
   a pellicle hinged to the photomask base, wherein the pellicle is movable between a first position in which the pellicle covers the photomask and a second position wherein the pellicle does not cover the photomask.

2. The pellicle device of claim 1, wherein the pellicle is opaque to photolithographic radiation.

3. The pellicle device of claim 1, wherein a portion of the pellicle is transparent to inspection radiation.

4. The pellicle device of claim 1, wherein the pellicle comprises a transport element.

5. The pellicle device of claim 1 and further comprising a securing mechanism to secure the pellicle with respect to the photomask.

6. The pellicle device of claim 5, wherein the securing mechanism is to provide vacuum.

7. Apparatus to protect a photomask comprising:
   a base to support the photomask;
   a pellicle coupled to the base with a coupling element that includes a hinge; and
   a transport element to move the pellicle between a first position to cover the photomask and a second position to expose the photomask to a source of photolithographic radiation.

8. The apparatus of claim 7, wherein the pellicle is opaque to the photolithographic radiation.

9. The apparatus of claim 7, wherein a portion of the pellicle is transparent to a source of inspection radiation.

10. The apparatus of claim 7, wherein the transport element comprises a robot arm coupled to the pellicle.

11. The apparatus of claim 10 and further comprising a transport unit coupled to the robot arm to move the robot arm.

12. The apparatus of claim 7 and further comprising a securing mechanism to secure the pellicle with respect to the photomask.

13. The apparatus of claim 12, wherein the securing mechanism is to provide vacuum.

14. The apparatus of claim 12, wherein the securing mechanism comprises a sealing element on the periphery of the pellicle, and a vacuum element coupled to the pellicle to provide a vacuum on the surface of the pellicle that is within the periphery.

15. A method comprising:
   protecting a photomask with a pellicle hinged to the photomask; and
   moving the pellicle away from the photomask when irradiating the photomask with photolithographic radiation.

16. The method recited in claim 15, wherein the photolithographic radiation is outside the visible light spectrum.

17. The method recited in claim 15, wherein the wavelength of the photolithographic radiation is within the range of 2 to 200 nanometers.

18. The method recited in claim 15, wherein the photolithographic radiation is from the group consisting of ultraviolet, deep ultraviolet, extreme ultraviolet, X-ray, electron beam, and ion beam.

19. The method recited in claim 15 and further comprising:
   replacing the pellicle when not irradiating the photomask with photolithographic radiation.

20. The method recited in claim 19 and further comprising:
   irradiating the photomask with a source of inspection radiation while the pellicle is covering the photomask.

21. The method recited in claim 15 and further comprising:
   when not irradiating the photomask with photolithographic radiation, securing the pellicle to the photomask.

22. The method recited in claim 21, wherein securing comprises using vacuum.

23. A method of using photolithographic equipment comprising a photomask, a pellicle hinged to the photomask, and a transport element, the method comprising:
   protecting the photomask with the pellicle when the photomask is not being irradiated by a source of photolithographic radiation; and
   using the transport element to move the pellicle away from the photomask when irradiating the photomask with photolithographic radiation.

24. The method recited in claim 23, wherein the wavelength of the photolithographic radiation is within the range of 2 to 200 nanometers.

25. The method recited in claim 23, wherein the photolithographic radiation is from the group consisting of ultraviolet, deep ultraviolet, extreme ultraviolet, X-ray, electron beam, and ion beam.

26. The method recited in claim 23 and further comprising:
   using the transport element to replace the pellicle when not irradiating the photomask with photolithographic radiation.

27. The method recited in claim 23 and further comprising:
   protecting the photomask with the pellicle when the photomask is being irradiated by a source of inspection radiation.

28. The method recited in claim 23 and further comprising:
   when not irradiating the photomask with photolithographic radiation, securing the pellicle to the photomask.

29. The method recited in claim 28, wherein securing comprises using vacuum.

* * * * *